(12) United States Patent
Lee et al.

(10) Patent No.: US 7,880,313 B2
(45) Date of Patent: Feb. 1, 2011

(54) SEMICONDUCTOR FLIP CHIP PACKAGE HAVING SUBSTANTIALLY NON-COLLAPSIBLE SPACER

(75) Inventors: Jae Soo Lee, Ichoen-si (KR); Geun Sik Kim, Sungnam (KR); Sheila Alvarez, Singapore (SG); Robinson Quiazon, Singapore (SG); Hin Hwa Goh, Singapore (SG); Frederick Dahilig, Singapore (SG)

(73) Assignee: Chippac, Inc., Fremont, CA (US)

( * ) Notice: Subject to any disclaimer, the term of this patent is extended or adjusted under 35 U.S.C. 154(b) by 0 days.

(21) Appl. No.: 11/282,293

(22) Filed: Nov. 17, 2005

(65) Prior Publication Data

US 2006/0192295 A1 Aug. 31, 2006

Related U.S. Application Data

(60) Provisional application No. 60/629,194, filed on Nov. 17, 2004.

(51) Int. Cl.
*H01L 23/495* (2006.01)
(52) U.S. Cl. .............................. 257/778; 257/E23.031; 257/E21.506; 257/E23.046; 257/E23.051; 257/E23.124; 257/E33.066; 257/E23.043; 257/E23.039; 257/E23.048; 257/E23.061; 257/E23.141; 257/666; 257/672; 257/667; 257/779; 257/696; 257/692; 257/774; 257/773; 257/737; 257/738

(58) Field of Classification Search ............... 257/774, 257/773, 778, E23.021, E23.033, E23.04, 257/E23.067, E23.124, E23.125, E23.047, 257/E23.048, E23.052, E23.036, E23.031, 257/E23.046, 675, 666, E21.001, E21.499, 257/E23.037, E23.039, E21.506, E23.301, 257/696, E23.051, 667, 779, 692, E33.066, 257/E23.043, E23.061, E23.141; 216/41, 216/14
See application file for complete search history.

(56) References Cited

U.S. PATENT DOCUMENTS

| 4,394,067 | A | * | 7/1983 | Spruijt et al. ............... 349/153 |
| 5,894,165 | A | * | 4/1999 | Ma et al. ..................... 257/666 |
| 6,083,645 | A |   | 7/2000 | Takeuchi |
| 6,373,125 | B1 | * | 4/2002 | Pannaccione et al. ....... 257/666 |
| 6,507,120 | B2 | * | 1/2003 | Lo et al. ..................... 257/778 |
| 6,661,087 | B2 | * | 12/2003 | Wu .............................. 257/692 |
| 6,683,369 | B2 | * | 1/2004 | Iwamoto ..................... 257/676 |
| 6,743,661 | B1 | * | 6/2004 | Drewery ..................... 438/110 |

(Continued)

FOREIGN PATENT DOCUMENTS

JP 5-335474 * 12/1993

(Continued)

*Primary Examiner*—Alexander O Williams

(57) ABSTRACT

A flip chip lead frame package includes a die and a lead frame having a die paddle and leads, and has a spacer to maintain a separation between the die and the die paddle. Also, methods for making the package are disclosed.

6 Claims, 5 Drawing Sheets

U.S. PATENT DOCUMENTS

| | | | |
|---|---|---|---|
| 6,750,546 B1 * | 6/2004 | Villanueva et al. | 257/778 |
| 6,826,827 B1 * | 12/2004 | Fjelstad | 29/830 |
| 6,841,462 B2 * | 1/2005 | Iwamoto | 438/613 |
| 6,876,087 B2 * | 4/2005 | Ho et al. | 257/778 |
| 6,906,415 B2 * | 6/2005 | Jiang et al. | 257/723 |
| 6,907,151 B2 * | 6/2005 | Yunus | 385/14 |
| 7,045,882 B2 | 5/2006 | Paek | |
| 7,045,883 B1 | 5/2006 | McCann et al. | |
| 7,064,009 B1 | 6/2006 | McCann et al. | |
| 7,112,871 B2 | 9/2006 | Shiu et al. | |
| 7,250,685 B2 * | 7/2007 | Shim et al. | 257/778 |
| 7,414,318 B2 * | 8/2008 | Shim et al. | 257/778 |
| 7,425,468 B2 * | 9/2008 | Wang et al. | 438/108 |
| 7,615,851 B2 * | 11/2009 | Lee et al. | 257/666 |
| 2002/0068417 A1 * | 6/2002 | Farnworth et al. | 438/455 |
| 2002/0079459 A1 * | 6/2002 | Dorscheid et al. | 250/370.11 |
| 2003/0067057 A1 * | 4/2003 | Wu | 257/666 |
| 2004/0104469 A1 * | 6/2004 | Yagi et al. | 257/723 |
| 2004/0232546 A1 * | 11/2004 | Kang | 257/730 |
| 2005/0006732 A1 * | 1/2005 | Perillat | 257/666 |
| 2006/0017173 A1 * | 1/2006 | Wu et al. | 257/778 |
| 2006/0214308 A1 | 9/2006 | Yu et al. | |
| 2007/0108624 A1 * | 5/2007 | Punzalan et al. | 257/778 |
| 2007/0111394 A1 * | 5/2007 | Lee et al. | 438/123 |
| 2008/0289038 A1 * | 11/2008 | Kim et al. | 726/22 |
| 2009/0309198 A1 * | 12/2009 | Lee et al. | 257/666 |

FOREIGN PATENT DOCUMENTS

JP        2000-299330        * 10/2000

* cited by examiner

SEMICONDUCTOR FLIP CHIP PACKAGE HAVING SUBSTANTIALLY NON-COLLAPSIBLE SPACER

CROSS REFERENCE TO RELATED APPLICATION

This application claims the benefit of U.S. Provisional Application No. 60/629,194, filed Nov. 17, 2004, titled "Integrated circuit system with substrate spacer", which is hereby incorporated by reference.

BACKGROUND

This invention relates to semiconductor packaging and, particularly, to flip chip packaging such as QFN ("Quad Flat No-lead") lead frame packaging and, in some aspects, to flip chip BGA ("Ball Grid Array") packaging.

A conventional QFN lead frame package includes a lead frame consisting of a centrally situated die paddle and peripheral leads, and a die attached to, and electrically connected with, the lead frame; and a molding or encapsulation that seals all of the parts of the die-and-lead frame assembly, and leaves land portions of the leads exposed for second-level interconnection of the package to circuitry in the environment of use, such as circuitry on a printed circuit board.

The die in a lead frame package may be a so-called flip chip die, which is situated in the package with the active side toward the lead frame, and which is attached and electrically connected to the leads by flip chip interconnections between peripheral pads on the die and bond sites on the leads. In some flip chip lead frame packages, there is no direct mechanical or electrical connection between the die and the die paddle, and electrical connections between the die and the lead frame are made only by way of connection of peripheral die pads with the leads. In many die, interconnect pads are situated in a central portion of the die in addition to the peripheral die pads; and particularly die pads for power and ground interconnection may be situated in a center portion of the die. In flip chip lead frame packages having such die, one or more electrical connections are made between interconnect pads situated in a central portion of the die and the die paddle.

Die having interconnect pads situated in a central portion of the die in addition to the peripheral die pads can alternatively be mounted on a substrate, such as a laminate substrate, comprising at least one dielectric layer and at least one patterned metal layer, as for example in a flip chip BGA package.

In a flip chip package, whether or not the die is electrically connected with the die paddle or the substrate, the active side is separated from the die paddle or the substrate. The separation must be sufficiently great to permit an inflow of the encapsulation material or molding compound between the die and the die paddle or substrate during the encapsulation or molding step, to reduce or eliminate formation of voids.

Moreover, where the flip chip interconnections are formed by remelt of solder, as the solder melts, the interconnect collapses and the die, not otherwise supported, moves toward the surface of the substrate or leadframe. As the interconnect collapses the solder can flow over any solder-wettable feature that it contacts and, accordingly, the molten solder can spread over a wide area of the lead or pad or leadframe. This can compromise the reliability of the interconnection.

SUMMARY

This invention is directed to, and in one general aspect the invention features, a flip chip package having, in addition to electrical flip chip interconnects, a spacer between the active side of the die and a surface of a support, which serves to maintain a separation (in the "z-direction") between the die and the support surface. In some embodiments the support is a lead frame; and in other embodiments the support is a substrate. The flip chip interconnect according to the invention is collapsible, that is, it is made of a material that melts or at least softens during the interconnect process. The spacer is substantially non-collapsible, that is, it does not shorten to a significant extent in the z-direction during the flip chip interconnnect process.

Preferably the spacer has a base at the support surface and a summit at the die active surface, and the base is wider than the summit; in some embodiments the spacer is generally conical; in some embodiments the spacer has a shape generally as a truncated sphere (for example, a hemisphere), the plane of truncation being in contact with the support surface. In some embodiments a width (or the diameter, where the shape of the base is generally round) of the base is less than about twice the width of an interconnect at the substrate, usually less than about the width of an interconnect at the substrate.

The material of the collapsible interconnect may be, for example, a low melt solder, such as a eutectic solder. The material of the spacer may be, for example, metal (such as gold) or a polymer such as an epoxy polymer a stud bump, According to one general aspect of the invention, a flip chip lead frame package includes a lead frame, including a centrally situated die paddle and peripherally arranged leads, the leads being separated from the die paddle; and a die mounted in a flip chip arrangement on the lead frame, by flip chip interconnection between peripheral pads on the active side of the die and bond sites on the leads, and a spacer between the lead frame and the die.

In some embodiments the package includes at least two, and usually three or four or more, spacers between the lead frame and the die. In some embodiments the spacer may be situated between the die and a lead, or between the die and the die paddle; or, at least one spacer may be situated between the die and a lead, and at least one additional spacer may be situated between the die and the die paddle.

According to another general aspect of the invention, a flip chip package includes a substrate, including a dielectric layer and a patterned metal layer; and a die mounted in a flip chip arrangement on a surface of the substrate by flip chip interconnection between pads on the active side of the die and bond sites (leads or pads) on the patterned metal layer, and a spacer between the lead frame and the die.

In some embodiments the package includes at least two, and usually three or four or more, spacers between the substrate and the die. In some embodiments the spacer may be situated near the periphery of the die footprint; or in an area near the center of the die footprint; or, at least one spacer may be situated near the periphery of the die footprint, and at least one additional spacer may be situated near the center of the die footprint.

In another general aspect the invention features a method for making a flip chip package, by providing at least one spacer on a surface of a support; providing a die having fusible metal interconnects attached thereon, wherein a height of the interconnects is greater than a height of the spacer; contacting the interconnects with bond sites on the support; melting the fusible metal so that the fusible metal interconnects collapse and the die contacts the spacer, and allowing the fusible metal to harden.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

Figure 1A:
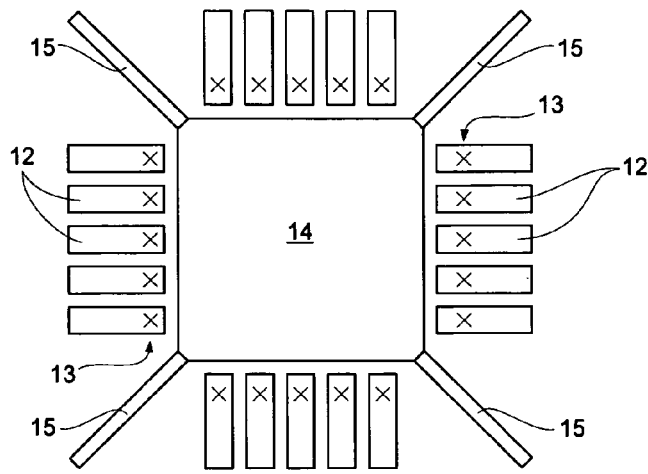
FIG. 1A is a diagrammatic sketch in a plan view showing a conventional lead frame.

Turning now to FIG. 1A, a conventional lead frame is shown in a diagrammatic plan view. The lead frame includes a central rectangular (for example, square) die paddle 14 having the remnants of tie bars 15 attached at the corners, and peripheral leads each including an outer lead portion 12 and an inner lead portion 13. The lead frame has a die attach surface (here referred to as the "upper" surface), on which the die is attached into which the die is electrically connected, and an opposite surface (here referred to as the "lower" surface), at which interconnection is made with underlying circuitry such as a printed circuit board. As shown in this example, the leads are arranged in rows, one row along each edge of the die paddle, with the inner lead portions separated from the die paddle by a space. Such a conventional lead frame is suitable for use with either a wire bonded die or a flip chip die. In a package using a wire bonded die, the die is affixed using a die attach adhesive onto a die attach area of the die paddle, with the active side of the die facing away from the die paddle. Interconnect pads on the die (not shown in this figure) are connected by wires to bond sites (shown at X on each lead in the figure) on the inner portions 13 of the leads. Where a flip chip die is used, the die is positioned with the active side of the die facing toward the die paddle, and with interconnect pads on the die aligned with bond sites on the inner portions 13 of the respective leads.

Figure 1B:
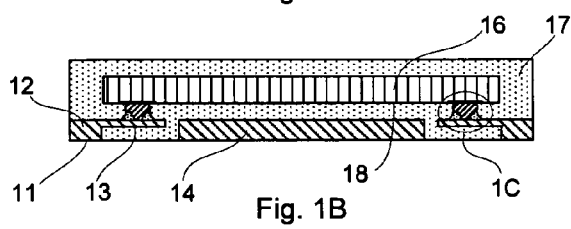
FIG. 1B is a diagrammatic sketch in a sectional view through a conventional flip chip QFN package.

FIG. 1B is a sectional view showing a conventional flip chip QFN package. The package includes a lead frame, including a die paddle 14, and leads having inner lead portions 13 and outer lead portions 12. Flip chip interconnects, for example 1C, which may be bumps or balls, are mounted on die pads 118 peripherally arranged in the active surface 18 of the die. The die is aligned over the lead frame, with the active side 18 of the die facing toward the die attach side of the lead frame, and is affixed to and electrically interconnected with the lead frame by bonding the flip chip interconnects onto the bond sites on the inner portions 13 of the respective leads 12. In the conventional flip chip QFN package, as shown for example in FIG. 1B, there is no connection between the die 16 and the die attach side of the die paddle. All the features of the package are enclosed by an encapsulant or molding 17 (formed by press molding or by liquid encapsulation) to seal and protect the die, the interconnections, and the lead frame; the lower surface of the lead frame, including the lower surface of the die paddle 14 and lands 11 on the lower surface of the outer lead portions 12 are left uncovered by the encapsulant or molding, so that they are exposed on the lower surface of the package. Electrical connection of the package to underlying circuitry such as, for example, a printed circuit board (not shown in the figures) is made by way of the lands 11. The die paddle in the conventional package is not connected electrically with the die or with the leads.

Figure 1C:
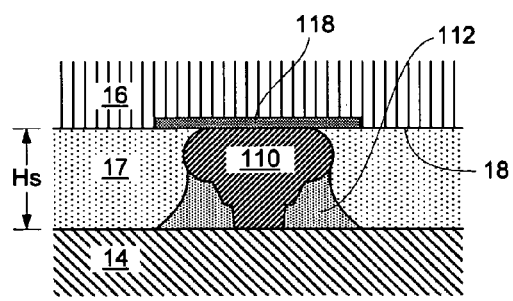
FIG. 1C is a diagrammatic sketch in a sectional view through a conventional flip chip QFN package, as at 1C in FIG. 1B.

One type of flip chip interconnection is shown by way of example in FIG. 1C. A gold (Au) bump 110 is formed on a die pad 118 in the active surface 18 of the die 16, typically in a so-called "stud bump" operation employing wire bond tools. The die is attached to and electrically connected to die to bond sites on the leads 14 by solder joint. A small quantity of a solder composition is disposed (for example in a dipping operation) onto parts of the bumps which will contact the surface of the leads; or is disposed onto target spots on the leads (for example by deposition through a pattern screen, or using a dispenser), and the connection is made by bringing the parts into contact and reflowing the solder, as shown for example at 112. The material (such as gold) of which the bump is made is substantially incompressible under the processing conditions, and particularly under the reflow temperature for the solder and the force applied between the die and the substrate, and, as a consequence, the standoff height Hs between the die and the lead frame is defined by the height of the bumps 110. The interconnection is mechanically stabilized by the encapsulant or molding 17. The bump height is designed to be sufficiently great as to permit inflow of the selected encapsulant material or molding compound during formation of the encapsulation or molding 17.

Figure 2A:
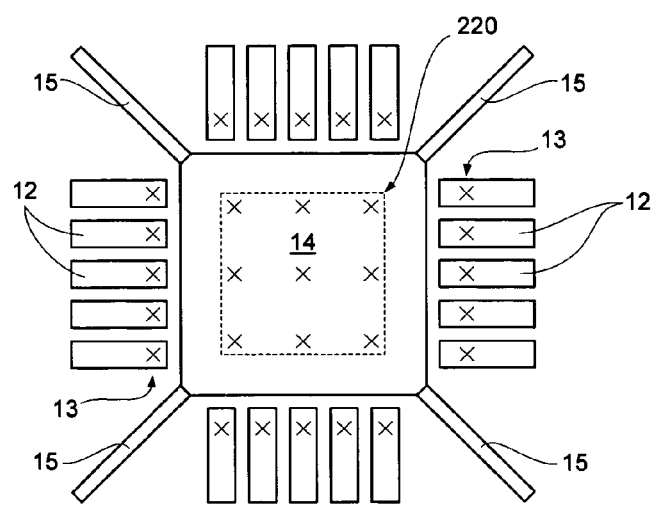
FIG. 2A is a diagrammatic sketch in a plan view showing a lead frame as employed in a flip chip QFN package having electrical interconnects between the die and the die paddle.
Figure 2B:
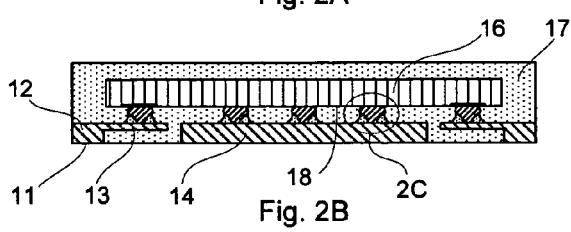
FIG. 2B is a diagrammatic sketch in a sectional view through a flip chip package having electrical interconnects between the die and the die paddle.
Figure 2C:
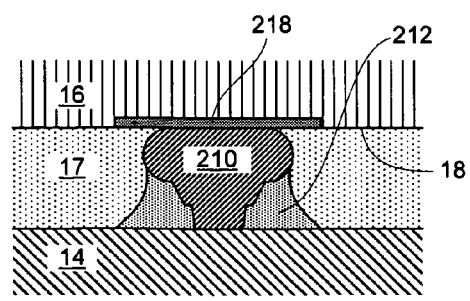
FIG. 2C is a diagrammatic sketch in a sectional view through a flip chip package having electrical interconnects between the die and the die paddle, as at 2C in FIG. 2B.

In some flip chip lead frame packages at least one site, and usually several sites, on a central portion of the active side of the die are connected to the die attach side of the die paddle. An example is illustrated in FIGS. 2A, 2B and 2C, electrical interconnection between the die pads and bond sites on the respective leads is made using a solder joint, generally as described above with reference to a conventional flip chip QFN package. In addition, at least one connection is made (and usually more: nine in the example shown in figures), using a similar solder joint, between bond pads located in an area near the center of the active side of the die and attachment sites on the die attach side of the die paddle. In the package shown in this figure, a conventional lead frame can be used, as shown in FIG. 1A. The sectional view in FIG. 2B shows, in addition to the features illustrated in FIG. 1B, the die paddle interconnects, for example 2C, between the central area of the active site of the die and the die paddle. In this example, as shown in FIG. 2A there is an array 220 of sites on the die paddle (shown by Xs in the figure), corresponding to an array of die paddle interconnects in a central area of the active site of the die, of which a row of three are shown in the sectional view in FIG. 2B. As illustrated in FIG. 2C, the die paddle interconnects 2C can be similar to the interconnects between the peripheral die pads and the leads. Particularly, a bump 210 is attached to a die pad 218, for example by using a stud bump operation, and the die paddle interconnections are made by solder reflow, as shown at 212, in the same reflow step by which the peripheral interconnects to the leads are made. The material (such as gold, or a high-melt solder) of which the bump is made is substantially incompressible under the processing conditions, and particularly under the reflow temperature for the solder and the force applied between the die and the substrate, and, as a consequence, the standoff height Hs between the die and the lead frame is defined by the height of the bumps 110. The interconnection is mechanically stabilized by the encapsulant or molding 17. The bump height is designed to be sufficiently great as to permit inflow of the selected encapsulant material or molding compound during formation of the encapsulation or molding 17.

Figure 3A:
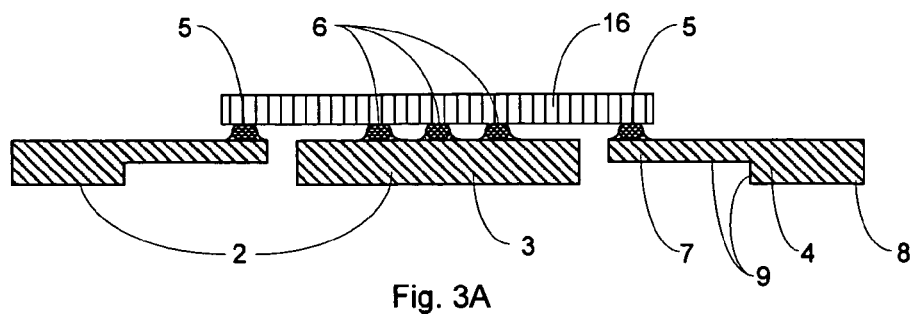
FIGS. 3A, 3B and 4A, 4B are diagrammatic sketches in sectional view showing stages before and after solder reflow in a conventional flip chip package having electrical interconnects between the die and the die paddle as well as between the die and the leads, in which the interconnects are formed by reflow of solder bumps.
Figure 3B:
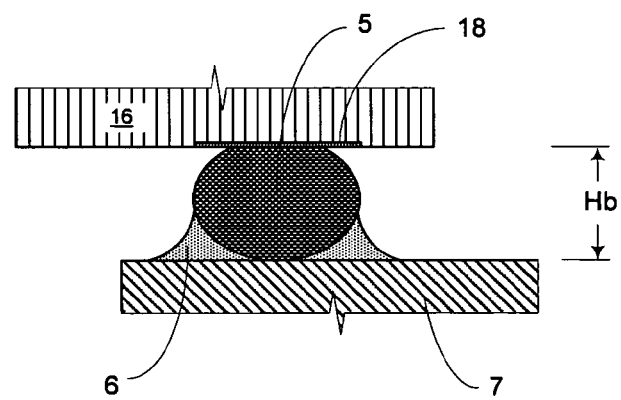
Figure 4A:
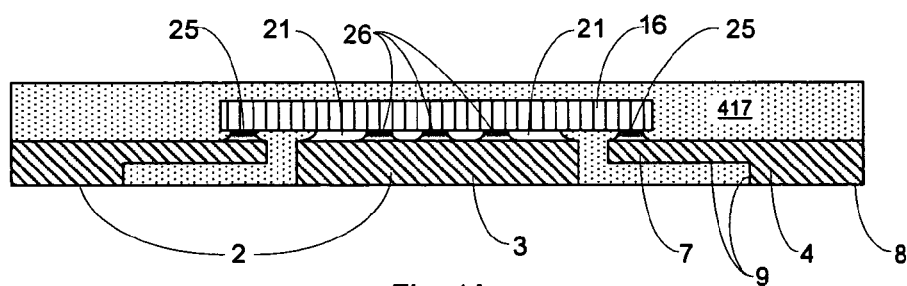
Figure 4B:
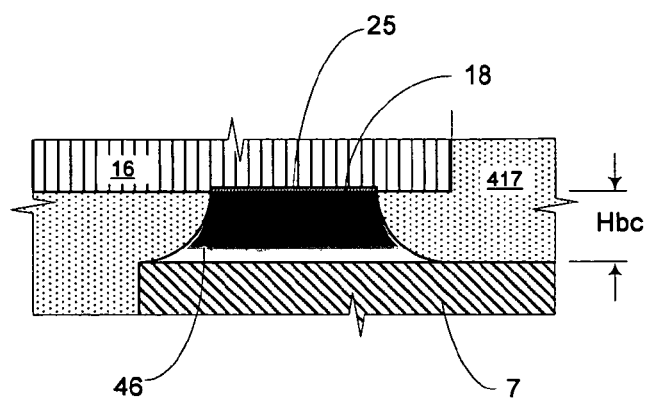

In conventional flip chip packages in which the interconnects are formed using a material which can collapse during the interconnection process, such as by reflow of a solder ball on the die pads, a die toward the surface of the lead frame or substrate during the melting step, as illustrated for example in FIGS. 3A, 3B, and 4A, 4B. Referring now to FIGS. 3A and 3B, a conventional lead frame 2 is provided, including a die paddle 3 and leads 4 which include an outer lead portion which includes the land 8, and an inner lead portion 7. Typically, the leads are partially etched at the land side, providing a step 9 by which they inner lead portions 7 are made thinner than the outer lead portions. Flip chip interconnects, for example 5 and 6, are formed on peripheral pads, for example 18, and more centrally arranged pads, respectively, in the active surface of the die. The die is aligned over the lead frame, with the active side facing toward the die attach side of the lead frame, and the interconnects are brought into contact with the die attach ("upper") surface of the lead frame, the interconnects 5 on the peripheral die pads contacting bond sites on the inner portions 7 of the leads, and the interconnects 6 on the more centrally arranged die pads contacting bond sites on the die paddle 3. As illustrated in detail in FIG. 3B, the interconnect may include a soft solder ball (for example, 5), and may additionally be provided a small quantity of solder paste 6 in an area of contact with the bond side, which may include a flux. Before the solder ball 5 is melted (and before the solder paste 6 if present is fused), the separation between the die and the lead frame is defined by the height Hb of the solder ball 5 (z-dimension).

To form the electrical interconnection, heat is applied to raise the temperature of the solder balls to a melting point, where the solder melts and the solder ball collapses. The melted solder spreads onto "wettable" surfaces with which it makes contact, and, as a result of the spread and collapse, the die and the lead frame come closer together, so that when the assembly is cooled and the solder alley in the interconnects 25, 26 hardens, the resulting standoff height Hbc is smaller. If the separation or standoff becomes too thin, the encapsulant or molding compound may not flow effectively through the thin space between the die and the surface of the lead frame, and the resulting encapsulation 417 may have undesirable voids, as shown for example at 21 in FIG. 4A.

According to the invention, the separation, that is the standoff height, between the active surface of the die and the surface of the support (lead frame or substrate) is maintained during melt and reflow of the soft solder (for example a eutectic solder) interconnects is sustained by providing one or more substantially noncompressible spacers at a surface of the support. The spacer has a base at the support surface, and a summit upon which the die will rest. The base of the spacer at the support surface is wider than the summit. The spacer may take any of a variety of shapes, such as a truncated sphere (where the flat contacts the support surface) or a cone (where the base of the cone contacts the support surface. In some embodiments a width (or the diameter, where the shape of the base is generally round) of the base is less than about twice the width of an interconnect at the substrate, usually less than about the width of an interconnect at the substrate. Other shapes are contemplated for the spacer.

Figure 5A:
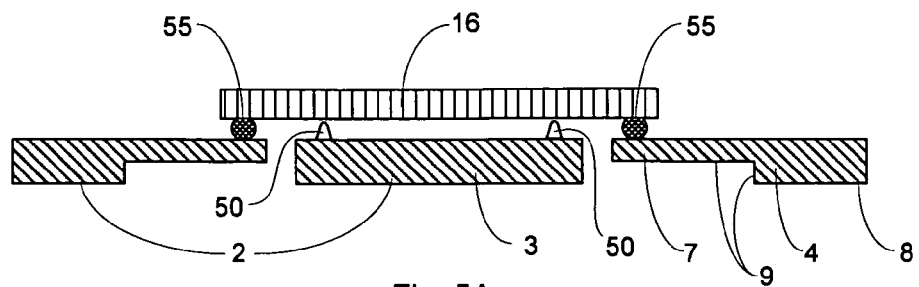
FIGS. 5A, 5B, and 6A, 6B are diagrammatic sketches in sectional view showing stages before and after solder reflow in a flip chip package according to an embodiment of the invention, having electrical interconnects between the die and the leads, in which the interconnects are formed by reflow of solder bumps, and having supports between the die and the die paddle to maintain the die standoff.
Figure 5B:
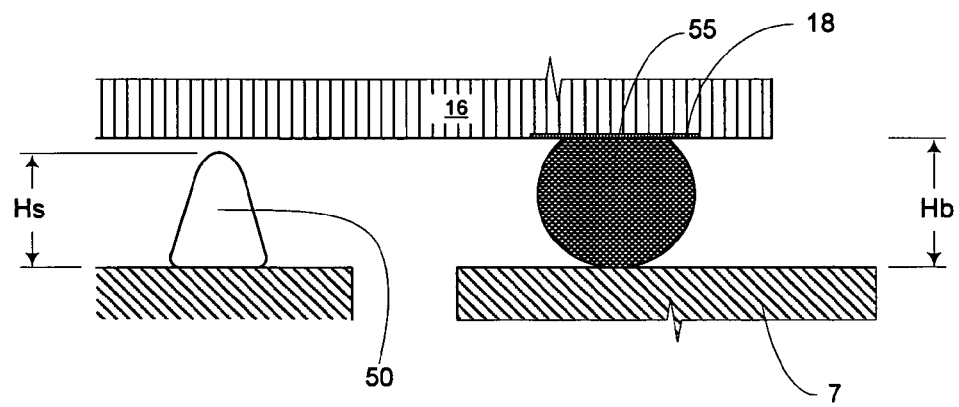
Figure 6A:
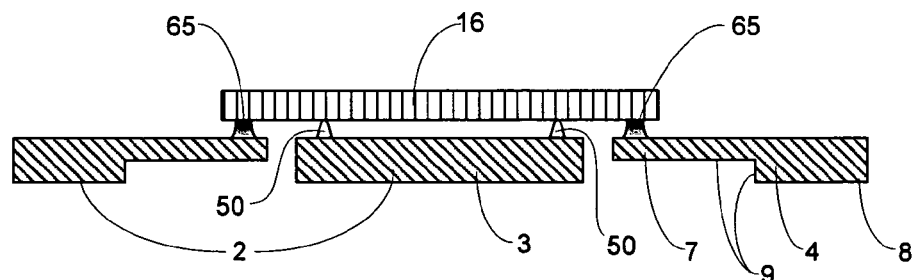
Figure 6B:
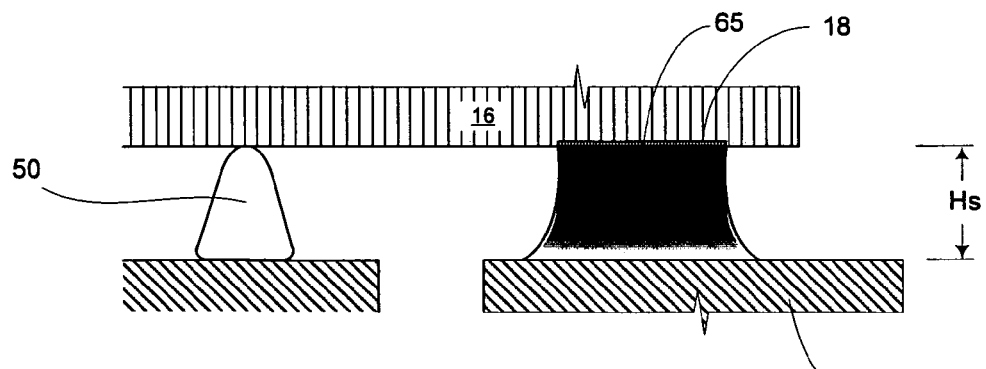

Referring now to FIGS. 5A, 5B and 6A, 6B, the formation of a flip chip assembly and completed package according to one aspect of the invention is shown. FIGS. 5A and 5B show a flip chip 16 aligned with a lead frame 2 having a die paddle 3 and leads 4 which include an outer lead portion which includes the land 8, and an inner lead portion 7, generally is described with reference to FIG. 3A. Spacers 50 are mounted on the die attach surface of the die paddle 3. A flip chip die 16 is provided, having solder balls 55 attached to peripherally arranged die pads 18. The height (z-direction) Hs of the spacers 50 is less than the height Hb of the balls, and the height (z-direction) Hs of the spacers 50 is at least as great as a required standoff height between the active surface of the die and the surface of the die paddle, as determined according to the flow characteristics of the encapsulant material or molding compound (such as, for example, an epoxy molding compound, or EMC) to be used in ceiling the package. The flip chip die 16, with the solder balls 55 attached, is oriented with the active surface of the die facing the lead frame 2, and so that the various solder balls 55 are aligned with the respective bond sites on the leads, and the die and lead frame are moved toward one another to bring the balls 55 into contact with the bond sites. As FIG. 5B illustrates, because the height of the spacer is less than the height of the uncollapsed ball, a small gap appears between the active surface of the die and the summit of a spacer.

Then, heat is applied to melt the solder in the balls 55, with the result that the solder spreads over wettable surfaces that it contacts, and the ball collapses to a narrow-waisted cylinder 65. Because the spacers 50 are substantially non-compressible, the movement of the die toward the lead frame is halted when the active surface of the die contacts the summits of the spacers 50 with each spacer 50 having a contact area on the flip chip 16 smaller than a contact area on a top surface of the die paddle 3. As a result, the standoff between the die and the lead frame is about the same as the height Hs of the spacers 50. In a subsequent molding or encapsulation procedure, the molding compound (EMC) or encapsulation material flows in the standoff zone between the die and the lead frame, providing a good seal for the package with no voids.

Figure 7A:
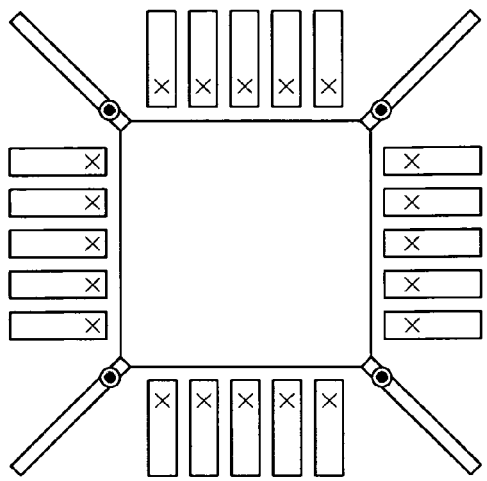
FIGS. 7A and 7B are diagrammatic sketches in plan view showing examples of alternative locations for the supports.
Figure 7B:
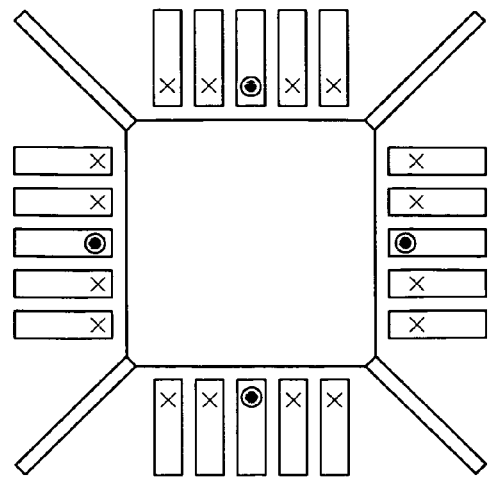

The spacers 50 may be arranged in any number and in any of a variety of ways on the lead frame. At least one spacer is required; and depending on the design of the package and the dimensions of the die and the support, it may be desirable to have at least three or, usually, four spacers arrange so as to provide stable support for the die during the collapse of the interconnects, and to ensure that the standoff between the die and the support is sufficiently thick and uniform. FIGS. 7A and 7B illustrate just two other wide variety of arrangements of four supports.

Figure 8A:
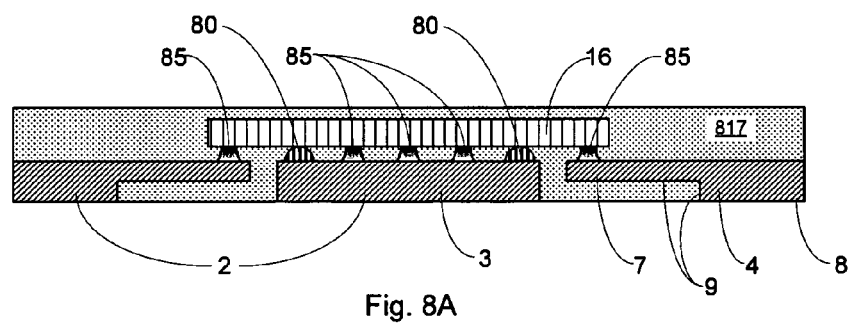
FIGS. 8A and 8B are diagrammatic sketches in sectional view showing a flip chip package according to an embodiment of the invention, having electrical interconnects between the die and the die paddle as well as between the die and the leads, after solder reflow.
Figure 8B:
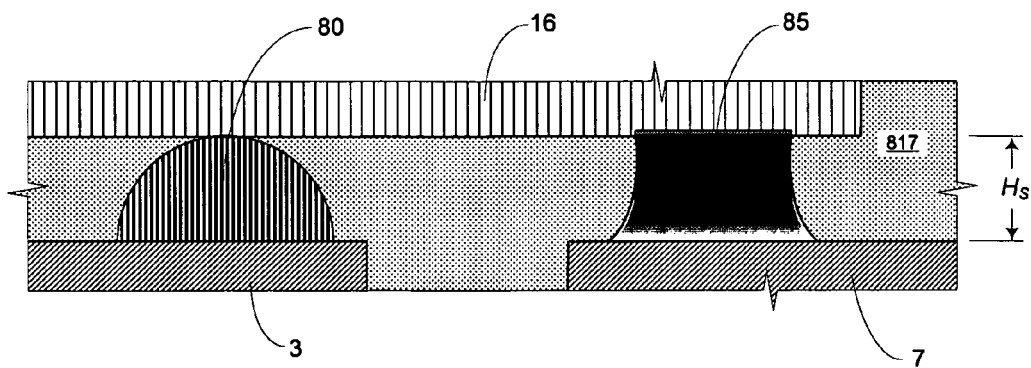

As noted above, the spacers may have any of the variety of shapes. FIGS. 8A and 8B show a package according to another embodiment of the invention, in which there are electrical interconnects between the die and the die paddle as well as between peripheral pads on the die and bond sites on the leads, and in which the spacers have the form of truncated spheres. In this example the spacers 80 are roughly hemispherical, and are mounted with the flat side of the hemisphere on the substrate (die paddle). Again, as in the example shown in FIGS. 5A, 5B, and 6A, 6B, the height Hs of the spacers 80 is selected to be less than the height of the uncollapsed solder balls 95 (see FIG. 9B), and the height (z-direction) Hs of the spacers 50 is at least as great as a required standoff height between the active surface of the die and the surface of the die paddle, as determined according to the flow characteristics of the encapsulant material or molding compound to be used in sealing the package.

Figure 9A:
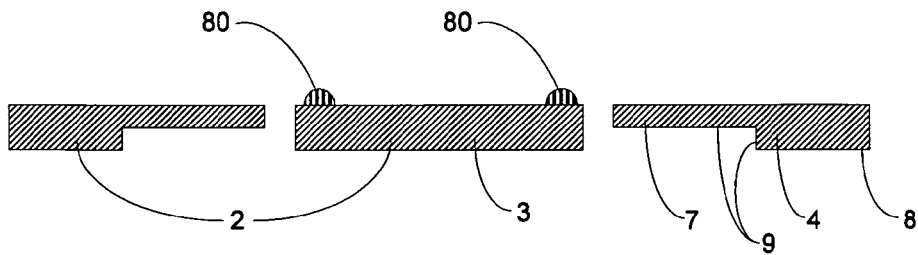
FIGS. 9A-9D are diagrammatic sketches in sectional view showing stages in making a package as in FIG. 8A.
Figure 9B:
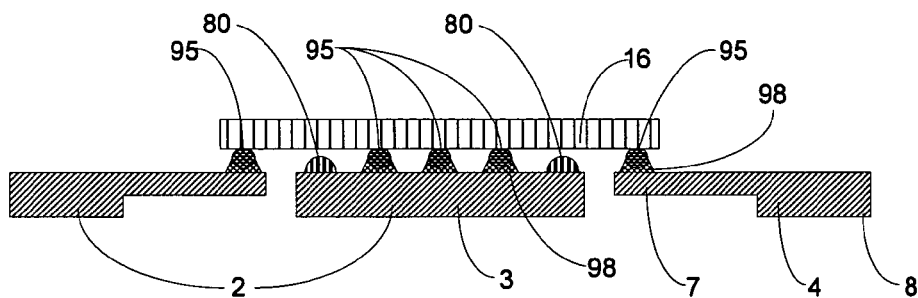
Figure 9C:
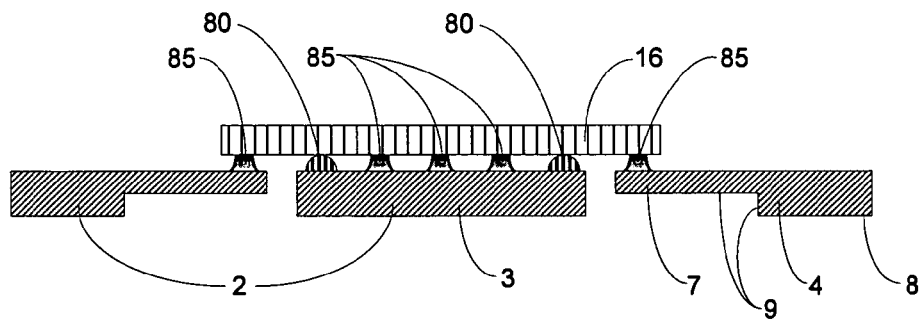
Figure 9D:
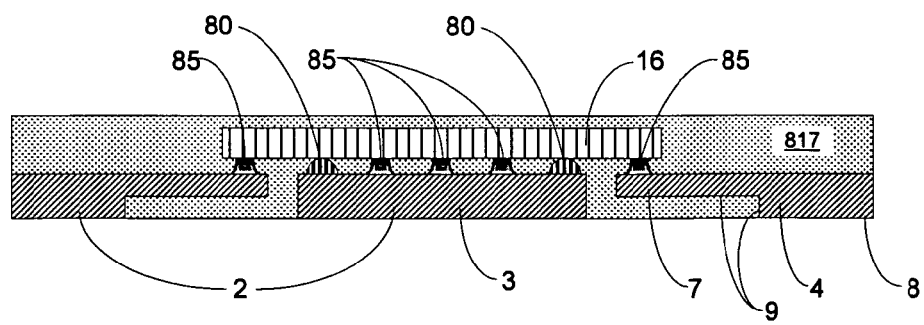

Stages in a process for making a package as in FIG. 8A are shown in FIGS. 9A-9D. In this example, spacers 80 are mounted on to the die attach side of a standard lead frame, as shown in FIG. 9A. Solder balls 95 are attached to pads on the active surface of a flip chip die 16. Optionally, a solder paste which may include a flux, is applied either to bond sites on the lead frame or to the balls, so that when the die 16 is aligned with the lead frame, and the balls are brought into contact with the bond sites on the lead frame, the solder paste is situated at the contact sites, as shown at 98 for example. Then heat is applied to melt the solder; the solder balls collapse in the solder spreads over solder-wettable surfaces. Because the spacers 80 are substantially non-compressible, the movement of the die Because the spacers 80 are substantially non-compressible, the movement of the die toward the lead frame is halted when the active surface of the die contacts the summits of the spacers. As a result, the standoff between the die and the lead frame is about the same as the height Hs of the spacers 80. In a subsequent molding or encapsulation procedure, the molding compound (EMC) or encapsulation material flows in the standoff zone between the die and the lead frame, providing a good seal 817 for the package, with no voids.

Flip chip interconnects that are overly broad (x-y plane) and short (z-direction)—that is, overcollapsed—can be unreliable, particularly as they are undercompliant and can fail during thermal cycling, because the support (substrate or leadframe) typically have different thermal expansion characteristics than the die. A taller flip chip interconnect may be more compliant, and therefor more robust. Advantageously according to the invention, the height of the spacers can be selected to maintain a suitably tall and narrow solder interconnect.

The spacers according to the invention may be formed of any of a variety of materials, and by using any of a variety of suitable techniques.

For example, the spacers may be metal bumps, such as gold or bumps, and may be formed using a wire bonding tool in a so-called stud bump operation. Where the spacers are metal bumps, and particularly where the metal is electrically conductive, the spacers must be electrically insulated either from the support surface or from the active surface of the die. On the die side, metal spacers can be arranged so that the contact of the die with the spacers is at sites having a suitable passivation. On the support surface side, where the support surface is a substrate such as a laminate substrate, metal spacers can be mounted on the substrate in such an arrangement that they do not contact any exposed electrical traces, and, particularly, the spacers can be mounted on areas are covered with a solder mask.

And, for example, the spacers may be formed of a polymeric material, which may be an epoxy. Epoxies and other polymers can be dispensed, for example from a syringe, in a suitable arrangement of dots; or polymers can be printed using a patterned screen or mask.

The spacers are small in the x-y plane; that is, they have a narrow and short footprint on the support surface. Usually, a width or length dimension of a spacer at the substrate according to the invention is less than about twice the width of an interconnect at the substrate, and more usually is less than about the width of an interconnect at the substrate. Also, the number of spacers is usually the minimum that is required to provide suitable support for the die during the ball collapse stage of the interconnect process. A greater number of spacers, or spacers of the greater size, are more likely to interfere with the flow of the encapsulation material or molding compound during the encapsulation or molding process. And, for example the spacer may have geometries other than those shown by way of examples. The spacer may have a rectangular (such as square) footprint (x-y plane), for example, so that it is generally pyramidal. And, although it may be preferred that the spacer be narrower at the summit (where it contacts the die) than at the base (where it rests on the support surface), it need not necessarily be so.

Other embodiments are within the following claims. For example, the support may be a substrate having at least one dielectric layer and at least one metal layer, such as a laminate or build-up substrate; and the substrate may have an array or bond sites beneath a central area of the die footprint for making electrical interconnection with more centrally located die pads as well as with peripheral die pads.

What is claimed is:

1. A flip chip package comprising a lead frame, including a centrally situated die paddle and peripherally arranged leads, the leads being separated from the die paddle; and a die mounted in a flip chip arrangement on the lead frame, by flip chip interconnection between peripheral pads on the active side of the die and bond sites on the leads, and a substantially non-collapsible spacer, having a contact area on the die smaller than a contact area on a top surface of the centrally situated die paddle, for resting an active side of the die.

2. The package of claim 1, comprising at least two spacers between the lead frame and the die.

3. The package of claim 1, comprising at least three spacers between the lead frame and the die.

4. The package of claim 1, comprising at least four spacers between the lead frame and the die.

5. The package of claim 1 wherein the spacer is situated between the die and a lead.

6. The package of claim 1 wherein the spacer is situated between the die and the die paddle.

* * * * *